US000001463H

United States Statutory Invention Registration [19]

[11] Reg. Number: H1463

Ota

[43] Published: Jul. 4, 1995

[54] METHOD FOR DETECTING POSITIONS OF PHOTOMASK AND SUBSTRATE

[76] Inventor: Kazuya Ota, c/o Nikon Corporation, 2-3, Marunouchi 3-chome, Chiyoda-ku, Tokyo, Japan

[21] Appl. No.: 11,353

[22] Filed: Jan. 29, 1993

[30] Foreign Application Priority Data

Feb. 3, 1992 [JP] Japan ..... 4-047494

[51] Int. Cl.[6] ..... G03F 9/00

[52] U.S. Cl. ..... 430/22; 430/5; 378/35; 250/491.1; 355/53; 355/77

[58] Field of Search ..... 430/5, 22; 378/35

[56] References Cited

U.S. PATENT DOCUMENTS

| | | | |
|---|---|---|---|
| 4,642,672 | 2/1987 | Kitakata | 430/22 |
| 4,835,078 | 5/1989 | Harvey et al. | 430/22 |
| 4,849,901 | 7/1989 | Shimizu | 364/468 |
| 5,087,537 | 2/1992 | Conway et al. | 430/22 |

FOREIGN PATENT DOCUMENTS

| | | | |
|---|---|---|---|
| 0161033 | 9/1984 | Japan | 430/5 |
| 0186016 | 9/1985 | Japan | 430/5 |

*Primary Examiner*—Ngoclan Mai

[57] ABSTRACT

A photomask having a pattern area having plurality of patterns to be transferred onto a transfer member generally regularly arranged thereon comprises a non-pattern area of a size no smaller than a size of at least one said pattern and provided at a predetermined position in said pattern area.

4 Claims, 5 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD FOR DETECTING POSITIONS OF PHOTOMASK AND SUBSTRATE

BACKGROUND OF THE INVENTION

1. Field of the Invention

A step-and-repeat type reducing projection exposure device (stepper) has been used to manufacture a semiconductor integrated circuit by a lithography process. In such an exposure device, an image of pattern formed on a photomask (hereinafter simply referred to as a mask) such as an original mask or a reticle is sequentially transferred to shot areas on a photosensitive substrate through a projection optical system.

2. Related Background Art

As a pattern to be transferred is minituarized, an aperture number of the projection optical system increases and a depth of focus of the projection optical system decreases. In order to keep the shot area of the photosensitive substrate within the depth of focus of a focal plane (focus point) of the projection optical system, the exposure device is equipped with an autofocus mechanism to focus the shot area of the photosensitive substrate to the focal point of the projection optical system. The autofocus mechanism may comprise a focus detection and transmission system for projecting an image of a slit pattern as a probe pattern to the shot area of the photosensitive substrate obliquely to an optical axis of the projection optical system, and a focus detection and reception system for receiving a reflected light of the image of the slit pattern and refocusing the image onto a photosensing device.

As the shot area of the photosensitive substrate moves along the optical axis of the projection optical system, the position of the image of the slit pattern on the photosensitive device changes. Thus, if the position of the refocused image when the shot area is positioned at the focal point of the projection optical system is known, a shift of the shot area from the focal point of the projection optical system can be detected. Based on the detection result, a table on which the photosensitive substrate is mounted is moved up and down to keep the shift within a predetermined range to conduct the autofocusing. For example, FIG. 7 shows a wafer 3 as the photosensitive substrate, and an exposure plane of the wafer 3 is divided into a plurality of shot areas 25. Each time the exposure is made to the shot area 25, the autofocusing is conducted.

In a pattern area of the mask in which a circuit pattern is formed, rectangular pattern units (for example, circuit devices) are periodically and finely arranged in rows and columns. Namely, the patterns for the mask are uniformly arranged in the pattern area, because more circuit devices can be formed in the shot area of the photosensitive substrate if the pattern area of the mask is fully utilized.

A plurality of layers of patterns are formed on the photosensitive substrate by repeating the lithography process such as exposure and development to the shot areas of the photosensitive substrate a predetermined number of times while a number of masks are exchanged. Fine uneveness is formed in each shot area of the photosensitive substrate by repeating the lithography process. In the semiconductor integrated circuit, since a level difference in the unevenness is much smaller than the depth of focus of the projection optical system, it does not cause a problem in detecting a shift of the shot area from the focal point of the projection optical system (focus detection).

However, the stepper is recently used not only for the manufacture of the semiconductor integrated circuit but also for the manufacture of a thin film head for a magnetic disk drive. In the manufacture of such a thin film head, a number of thin film heads, for example, 100 heads are formed in one shot area. For example, as shown in FIG. 8, in the thin film head, a difference (level difference) between a substrate plane and a top plane of the thin film head is relatively large, for example, approximately 30 μm. In FIG. 8, numeral 26 denotes a projection which is periodically formed on a wafer as a thin film head, and patterns of the thin film head are formed in multi-layers on the projection 26. In order to form the uneven patterns having the large level difference, the unevenness is gradually formed on the photosensitive substrate by the lithography method while a number of masks are exchanged.

When the uneven pattern having a small pitch and a large level difference is to be formed, it is necessary to focus the shot area to be exposed to the focal plane of the projection optical system. To this end, as shown in FIG. 8, it is necessary to project a probe pattern 27 such as a slit pattern to a projection or a recess of the shot area to exactly detect the position of the projection or the recess relative to the focal plane of the projection optical system. However, if the area of the projection or the recess is smaller than the size of the probe pattern, the probe pattern is projected to the projection and the recess simultaneously so that the level of the projection or the recess cannot be exactly detected.

SUMMARY OF THE INVENTION

It is an object of the present invention to provide a photomask for forming a pattern which permits exact detection of a position even if the pattern formed has a relatively small pitch and evenness of a small level difference when the pattern is to be formed on a transfer member by transferring the pattern of the photomask by an exposure device.

In a first photomask of the present invention, as shown in FIG. 4, the photomask 1 has pattern areas having unit patterns 20 to be transferred onto a transfer member substantially regularly and repeatedly arranged thereon, and a non-pattern area 18 which has no unit pattern and has an area which is at least no smaller than the area of one unit pattern arranged at a predetermined position in the pattern area.

In this case, as shown in FIG. 5, a reference mark 21 for two-dimensionally and relatively positioning the photomask 1 and the transfer member may be provided in the non-pattern area 18.

In a second photomask of the present invention, as shown in FIGS. 1–3, the photomask 1 has a pattern area 17 having a plurality of unit patterns to be transferred onto the transfer member 3 formed thereon and is to be used in a projection exposure device having a position detection mechanism 8, 9 for detecting a position of at least one detection area 19 in a reference area 17I on the transfer member on which the unit patterns are transferred, along an optical axis of the projection optical system 2. A non-pattern area 18 having an area substantially the same as or larger area than the area corresponding to the detection area 19 is provided at a portion in the pattern area 17 corresponding to the detection area 19.

A method for detecting a position of the detection area 19 on the transfer member along the optical axis of the projection optical system when the image of the photomask 1 is repeatedly projected onto the transfer member 3 through the projection optical system 2, comprises the steps of exposing the image of the photomask 1 having the pattern area 17 in which the unit patterns are formed and the non-pattern area 18 in which the unit pattern is not formed onto the transfer member 3 through the projection optical system 2, processing the transfer member 3 to form a step relative to the surface of the transfer member on the exposed transfer member at the position 17I corresponding to the pattern area and not to form a step on the exposed transfer member at the position 18I corresponding to the non-pattern area, and detecting the position along the optical axis by using the position 18I corresponding to the non-pattern area on the transfer member as the detection area.

In accordance with the photomask of the present invention, the non-pattern area is formed at the specified area in the pattern area, and no circuit pattern is formed in the non-pattern area. Accordingly, after the transfer member has been processed by the lithography process, the area of the transfer member on which the non-pattern area is transferred is a flat area without pattern. Whether the non-pattern area is a light screening area or a light transmitting area, or depending on the type of photosensitive material of the transfer member, the flat area may be either a projecting area or a recessed area. In any case, when the projection optical system is used, a probe pattern for detecting the focus is projected to the flat area on the transfer material corresponding to the non-pattern area in order to detect a positional shift of the transfer member from the focal point of the projection optical system so that the positional shift of the flat area can be exactly detected.

When the positioning reference mark is provided in the non-pattern area of the photomask, the image of the reference mark is transferred to the flat area of the transfer member corresponding to the non-pattern area. Since the transferred reference mark is formed in the flat area, it can be readily detected. With if the reference mark present in the flat area, the shift of the flat area from the focal point can be detected without being affected by the step of the reference mark if a larger probe pattern for detecting the focus than the transferred reference mark is projected. Accordingly, the focus detection and the alignment of the transfer member are attained.

A pattern is generally regularly arranged in the areas other than the non-pattern area of the photomask, but no alignment mark need be inserted in each pattern so that the size of each pattern can be reduced. When a number of such small patterns are generally regularly formed into a mask, not the same number of alignment marks as the number of patterns is required, and one to four marks per pattern area is usually sufficient. Accordingly, the pattern can be formed as the perfect repetition of the same pattern by forming the reference mark as the alignment mark in the non-pattern area. Since the pattern area of the photomask consists of two types of pattern, that is, one pattern and the non-pattern including the reference mark, the design of the pattern of the photomask is easy.

In accordance with the second photomask of the present invention, the non-pattern area of substantially the same size as or larger than the area corresponding to the detection area (in which the focus detection probe pattern is projected) in the reference area on the transfer member is formed. Accordingly, even if the transfer member is processed by the lithography process, a flat area of the substantially the same size as or larger than the area of the detection area is formed on the transfer member in correspondence with the non-pattern area so that the position detection along the optical axis of the projection optical system can be conducted by using the flat area.

When the first or second photomask of the present invention is used, the area on the transfer member corresponding to the non-pattern area is flat even after the lithography process. Accordingly, the stable focus detection is always attained by using the flat area. Thus, even if the pattern on the transfer member which is formed by transferring a pattern of other areas of the mask has a relatively small pitch and deep unevenness, the focus detection for the projection or recess of the uneven pattern can be exactly detected.

Where the positioning reference mark is provided in the non-pattern area, the focus detection and the alighment of the transfer member can be attained by using the area on the transfer member corresponding to the non-pattern area. Accordingly, it is not necessary to form the alignment mark in other areas of the mask and the pattern area of the mask can be effectively utilized and the design of the mask pattern is facilitated.

DETAILED DESCRIPTION OF THE PREFERRED EMBODIMENTS

The preferred embodiments of the present invention are now explained with reference to FIGS. 1–6. In the embodiments, the present invention is applied to a mask to be used when a thin film head for a magnetic disk drive is manufactured by using a reduction projection type exposure device.

Figure 1:
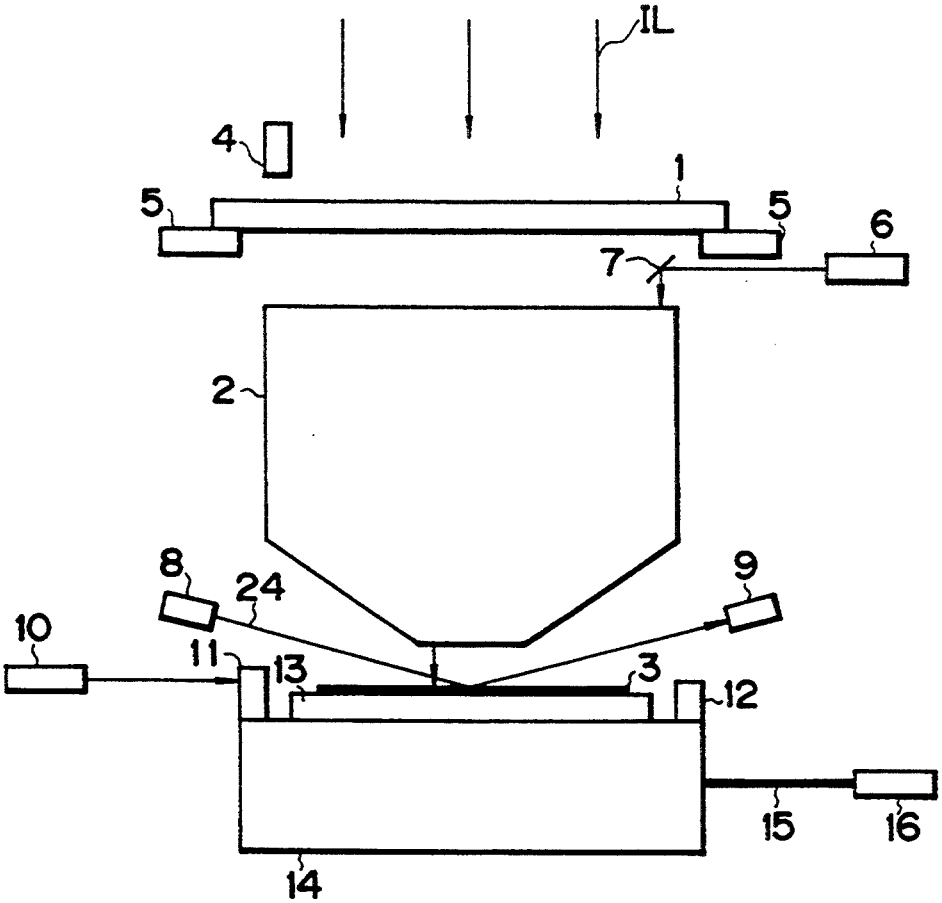
FIG. 1 shows a simplified construction of a reduction projection type exposure device in which a mask of an embodiment of the present invention is used.

FIG. 1 shows a simplified construction of major portions of a reduction projection type exposure device in which a mask of the present embodiment is used. In FIG. 1, numeral 1 denotes a mask, numeral 2 denotes a projection optical system and numeral 3 denotes a wafer as a photosensitive substrate. A pattern of the mask 1 mounted on a reticle holder 5 is transferred to each shot area of the wafer 3 at a predetermined reduction factor (for example 1/5) through the projection optical system 2. An alignment microscope 4 is fixed above an area beyond a pattern area of the mask 1.

Numeral 6 denotes a wafer alignment optical system arranged on a bottom surface of the reticle holder 5. The alignment light from the wafer alignment optical system 6 is irradiated to the wafer 3 through a mirror 7 and the projection optical system 2. The position of the wafer 3 can be detected by sensing a reflected light from the wafer 3 by the wafer alignment optical system 6 through the projection optical system 2 and the mirror 7. Numeral 8 denotes a focus detection and transmission system, and numeral 9 denotes a focus detection and reception system. A focus detection probe pattern is projected onto the wafer 3 obliquely to an optical axis of the projection optical system 2 by the focus detection and transmission system 8. A light obliquely reflected from the image of the probe pattern on the wafer 3 is sensed by the focus detection and reception system 9, which produces a focus signal representing the position of the wafer 3 along the optical axis of the projection optical system 2.

The wafer 3 is mounted on a wafer holder 13 which in turn is mounted on a wafer stage 14. A mirror 11 and a reference mark 12 are mounted in the vicinity of the wafer holder 13 on a top surface of the wafer stage 14, and a laser beam from a laser interferometer 10 is reflected by the mirror 11. The wafer stage 14 is connected to a drive motor 16 through a lead screw 15. A predetermined shot area of the wafer 3 can be sequentially moved into an image field of the projection optical system 2 by driving the drive motor 16 to move the top surface of the wafer stage 14 perpendicularly to the optical axis of the projection optical system 2 in a two-dimensional plane. In this case, the position of the wafer stage 14 is measured by the laser interferometer 10. A Z-stage is built in the wafer stage 14 to move the wafer 3 along the optical axis of the projection optical system 2.

In this case, an alignment mark is formed in the vicinity of the pattern area of the mask 1, and the mask 1 is illuminated by an illumination light IL emitted from an illumination optical system, not shown, while the reference mark 12 on the wafer stage 14 is arranged in the image field of the projection optical system 2. The relative positioning of the reference mark 12 and the mask 1 is effected by sensing the reflected light from the alignment mark of the mask 1 and the reference mark 12 by the alignment microscope 4.

A light emissive mark may be used as the reference mark 12. The position of the wafer 3 is detected by the wafer alignment optical system 6 arranged near the bottom surface of the mask 1. In this case, the relative position of the wafer alignment optical system 6 to the reference mark 12 can be determined by previously detecting the reference mark 12 by the wafer alignment optical system 6.

In the exposure mode, the wafer 3 is sequentially driven at a predetermined pitch by the movement of the wafer stage 14, and the image of the pattern of the pattern area of the mask 1 is exposed to the entire area of each shot area of the wafer 3. In this case, since the wafer is not perfectly flat and the depth of focus of the projection optical system 2 is shallow, it is necessary to detect the level (Z-direction) of the wafer 3 for each exposure shot and adjust the level to the focal plane of the projection optical system 2. In the present embodiment, the focus detection is effected by the focus detection and transmission system 8 and the focus detection and reception system 9.

Various examples of pattern arrangement of the mask 1 to be used in the reduction projection type exposure device of FIG. 1 are now explained.

First Embodiment

Figure 2:
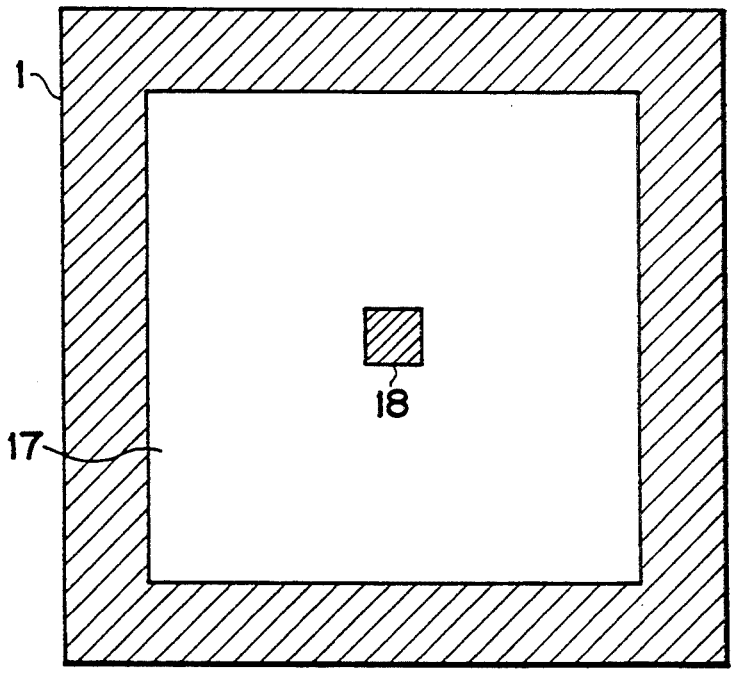
FIG. 2 shows a plan view of a mask in a first embodiment of the present invention.

FIG. 2 shows a mask 1 in the first embodiment. In FIG. 2, numeral 17 denotes a pattern area. An exposure light is irradiated to the entire area of the pattern area 17. A non-pattern area 18 is formed in a portion of the pattern area 17, and a pattern of a thin film head is formed in the entire area of the pattern area 17 other than the non-pattern area 18. The non-pattern area 18 may be either a light screening area, a light transmitting area or a transluscent area.

Figure 3:
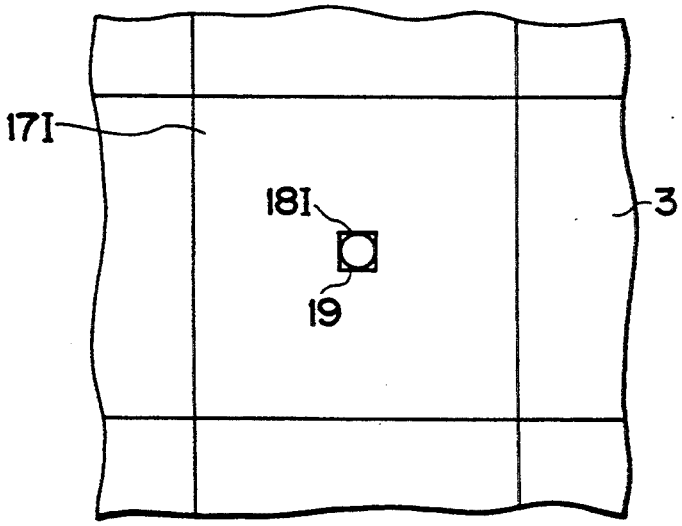
FIG. 3 shows a plan view of an area on a wafer on which the pattern of the mask of FIG. 2 is transferred.

FIG. 3 shows a shot area on the wafer on which the pattern of mask 1 of FIG. 2 is transferred. The image of the pattern area 17 of FIG. 2 is transferred to the shot area 17I of FIG. 3, and the image of the non-pattern area 18 of FIG. 2 is transferred to the area 18I of FIG. 3. Numeral 19 denotes a probe pattern projected into the shot area 17I of FIG. 3 from the focus detection and transmission system 8 of FIG. 1. In the present embodiment, the size of the area 18I on which the non-pattern area 18 is transferred is larger than the probe pattern 19.

In the semiconductor manufacturing process, the lithography process is repeated many times, but when the mask 1 having the non-pattern area 18 as shown in FIG. 2 formed therein is used in each step, the area in which the focus detection probe pattern 19 is projected is always kept flat. Thus, the focus detection is not affected by the unevenness of the pattern.

Assuming that the area 18I is at a lower level than the area 17I (particularly the projection of the pattern ) in FIG. 3, the level ( Z-coordinate ) of the area 18I is detected by projecting the probe pattern 19. When it is required to align the focal plane of the projection optical system to the projection of the pattern on the wafer 3, the wafer 3 is displaced to a level equal to a sum of the Z coordinate detected by the area 18I corresponding to the non-pattern area 18 and an offset corresponding to the height of the projection of the pattern. In this case, the offset value is determined by previously measuring the level difference between the wafer and the pattern.

Second Embodiment

Figure 4:
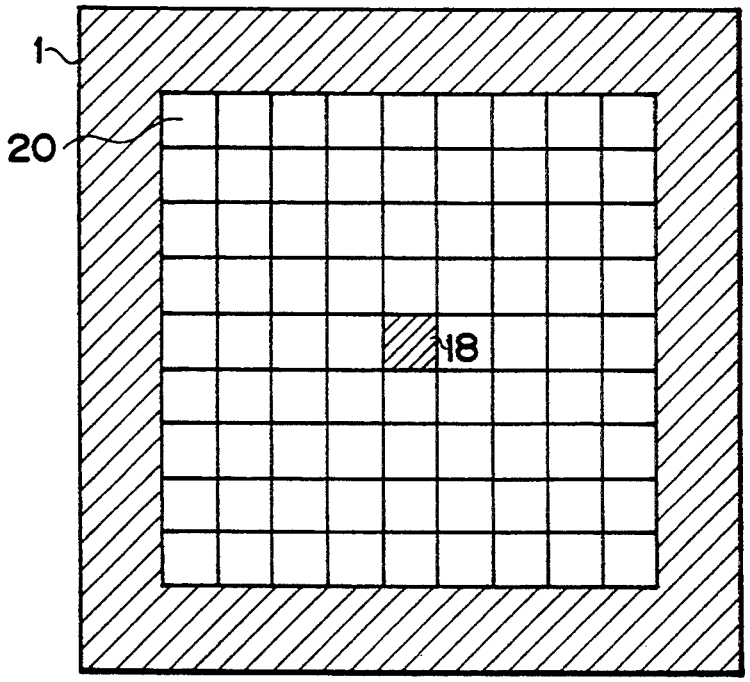
FIG. 4 shows a plan view of a mask in a second embodiment.
Figure 8:
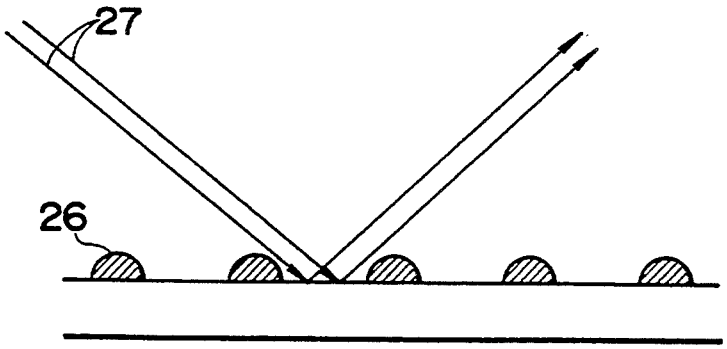
FIG. 8 shows a sectional view of a wafer showing a relationship between a wafer and a focus detection beam.

FIG. 4 shows a mask 1 in a second embodiment of the present invention. In FIG. 4, the pattern area of the mask 1 is divided into 9×9 sub-areas of the same size. Each sub-area represents a minimum unit of the pattern such as a thin film head and the same device pattern 20 is formed in each sub-area. The device pattern 20 corresponds to the projection 26 shown in FIG. 8. A center sub-area of the 9×9 sub-areas is a non-pattern area 18. The size of the non-pattern area 18 is equal to the size of one device pattern 20. Like in the first embodiment, the size of the area on the wafer corresponding to the non-pattern area 18 is larger than the size of the focus detection probe pattern.

The size of the non-pattern area 18 may be as large as the area of several device patterns 20 instead of one device pattern 20. For example, when the pattern depicted on the mask is the repetition of a cell which is sufficiently small relative to the entire area of the mask and several tens to several hundreds patterns of the same device are to be formed and when the size of the probe pattern corresponds to the size of one to several projected images of the device pattern, the size of the non-pattern area 18 may be adjusted to the size of one to several repetitive device patterns 20 so that the non-pattern area 18 may be formed without imparting a load to the design of the mask pattern.

Accordingly, the mask design and the arrangement of the repetitive device patterns 20 are smoothly effected. An economic photo-repeater may be used instead of by an electron beam in the manufacture of the mask.

Third Embodiment

Figure 5:
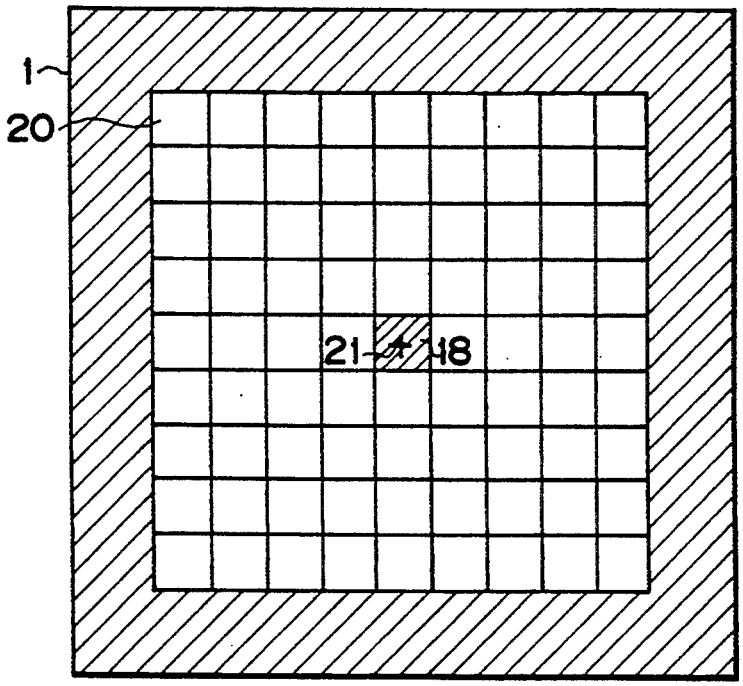
FIG. 5 shows a plan view of a mask in a third embodiment.

FIG. 5 shows a mask 1 in a third embodiment of the present invention. In FIG. 5, the like elements to those of FIG. 4 are designated by the like numerals and the detailed explanation thereof is omitted. In FIG. 5, numeral 18 denotes a non-pattern area which is of the same size as that of one repetitive device pattern 20. A cross-shaped wafer alignment mark 21 is provided in the non-pattern area 18. No alignment mark is provided on the mask 1 other than the wafer alignment mark 21. The wafer alignment mark 21 is cross-shaped to conduct the alignment in the X-direction and the Y-direction.

The wafer alignment mark 21 is formed by a transparent member or a light screening member depending on whether the non-pattern area 18 is a light screen area or a transparent area. The projected image of the wafer alignment mark 21 is made sufficiently smaller than the probe pattern 19 of FIG. 3 so that the focus detection is not affected thereby. The alignment mark may be formed without causing significant unevenness on the wafer (for example, within the range of the depth of focus 10 of the projection optical system), and in the process which creates large unevenness, the mask having no alignment mark formed thereon as shown in FIG. 4 may be used. By setting a detection wavelength of the wafer alignment optical system 6 of FIG. 1 outside of the range of photosensing wavelength of the photosensitive material, the same alignment mark can be used over a number of steps.

In the third embodiment, since it is not necessary to put the alignment mark in the device pattern 20, the size of one device pattern 20 can be somewhat reduced. Where there are several tens to several hundreds device patterns in the mask, a substantial area may be saved as a whole. Where the alignment marks are not put in all device patterns but they are put in only specified device patterns, other arrangement may be disturbed if the device pattern is larger than other device patterns. In practice, therefore, all device patterns should be of the same size, and the saving of area is not attained.

Where the shape of the alignment mark is to be changed by the change of the construction of the alignment optical system, the device pattern need not be changed and only the wafer alignment mark in the non-pattern area need be changed. Accordingly, the design of the mask is facilitated. Where the photo-repeater is used in the manufacture of the mask, the mask of the device pattern which has been previously used may be used as it is.

Fourth Embodiment

Figure 6:
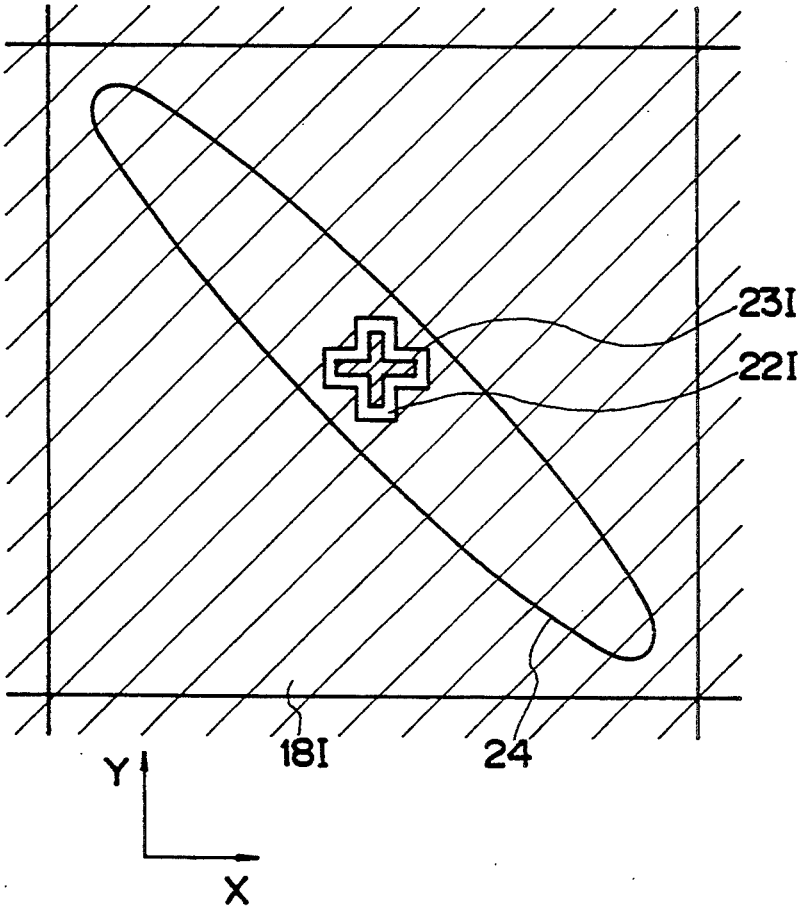
FIG. 6 shows an enlarged plan view of an area on a wafer on which a pattern of a mask in a fourth embodiment is transferred.
Figure 7:
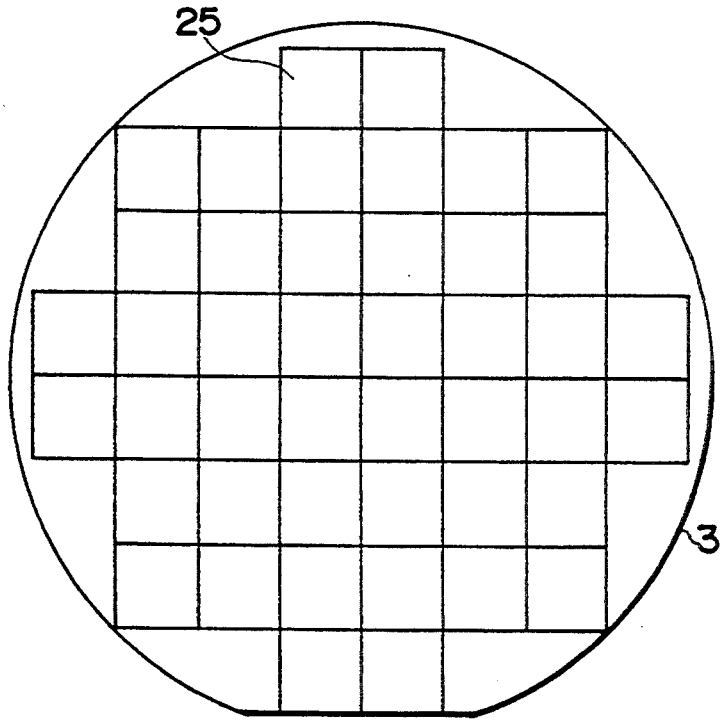
FIG. 7 shows a plan view of a wafer on which a mask pattern is transferred.

A fourth embodiment is a modification of the wafer alignment mark 21 of FIG. 5. FIG. 6 shows the transfer of a pattern of a mask of the present embodiment to a shot area on the wafer. In FIG. 6, an area 18I corresponds to the projected image of the non-pattern area 18 of the mask 1 of FIG. 5. In this case, a cross-shaped alignment mark 23I is formed at a center of the area 18I and a framing area 22I is formed around the mark 23I. Where the non-pattern area 18 of the mask 1 is a light screening area, a wafer alignment mark of a cross-shaped light screening area sandwiching a transparent framing area is formed therein. On the other hand, where the non-pattern area 18 of the mask 1 is a transparent area, a wafer alignment mark of a cross-shaped transparent area sandwiching a light screening framing area is formed therein.

In FIG. 6, a slit pattern 24 which is larger than the image 22I of the framing area of the image of the wafer alignment mark is projected as a probe pattern. In FIG. 6, since the area of the image 23I of the wafer alignment mark is a flat area at the same level as other areas of the area 18I, the focus detection is effected more exactly and the detection of the wafer alignment mark formed on the wafer is facilitated.

In the present embodiment, the non-pattern area is formed only at the center in the pattern area on the mask although it is not limitive. For example, at least three non-pattern areas may be provided in the periphery of the pattern area 17 shown in FIG. 2. The positions of the non-pattern areas in the pattern area 17 transferred onto the wafer are detected, and the inclination of the pattern area 17I on the wafer may be determined based on the detection results to adjust the inclination.

The present invention is not limited to the above embodiments but various modifications thereof may be made without departing from the gist of the invention.

What is claimed is:

1. A photomask having formed thereon a pattern area having a plurality of thin film head patterns to be transferred onto a local area of a transfer member, said photomask being used in a projection exposure device having a position detection mechanism for detecting a position of at least one predetermined detection area in said local area on said transfer member having said thin film head patterns transferred thereon, along an optical axis of a projection optical system, said photomask comprising:

a non-pattern area of a size substantially equal to or larger than a size corresponding to a size of said detection area and provided at a portion in said pattern area corresponding to said local area;

said non-pattern area being transferred as a flat area on said transfer member.

2. A photomask according to claim 1, wherein said non-pattern area has no said thin film pattern.

3. A photomask according to claim 1 having a reference mark in said non-pattern area for two-dimensionally and relatively positioning said photomask and said transfer member.

4. A method for detecting a position, along an optical axis of a projection optical system, of a detection area on a transfer member in projecting an image of a photomask repeatedly onto said transfer material through said projection optical system, comprising the steps of:

exposing the image of said photomask including a pattern area having unit patterns formed thereon and a non-pattern area having no said unit pattern onto said transfer member through said projection optical system;

processing said transfer member to form a step relative to a surface of said transfer member at a position on said exposed transfer member corresponding to said pattern area and not to form the step at a position on said exposed transfer member corresponding to said non-pattern area; and detecting the position along the optical axis by using the position on said transfer member corresponding to said non-pattern area as said detection area.

* * * * *